(12) United States Patent
Kim

(10) Patent No.: US 10,396,005 B2
(45) Date of Patent: Aug. 27, 2019

(54) FAN-OUT SEMICONDUCTOR PACKAGE

(71) Applicant: SAMSUNG ELECTRONICS CO., LTD., Suwon-si (KR)

(72) Inventor: Min Kyu Kim, Suwon-Si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/969,480

(22) Filed: May 2, 2018

(65) Prior Publication Data

US 2019/0189528 A1 Jun. 20, 2019

(30) Foreign Application Priority Data

Dec. 14, 2017 (KR) ........................ 10-2017-0172321

(51) Int. Cl.
| | |
|---|---|
| *H01L 23/00* | (2006.01) |
| *H01L 23/31* | (2006.01) |
| *H01L 23/498* | (2006.01) |
| *H01L 23/66* | (2006.01) |
| *H01L 23/13* | (2006.01) |

(52) U.S. Cl.
CPC .......... *H01L 23/3128* (2013.01); *H01L 23/13* (2013.01); *H01L 23/49816* (2013.01); *H01L 23/49827* (2013.01); *H01L 23/66* (2013.01); *H01L 24/16* (2013.01); *H01L 24/32* (2013.01); *H01L 2223/66* (2013.01); *H01L 2224/16221* (2013.01); *H01L 2224/32221* (2013.01);
(Continued)

(58) Field of Classification Search
CPC ................. H01L 23/3128; H01L 23/13; H01L 23/49816; H01L 23/49827; H01L 23/66; H01L 24/16; H01L 24/32; H01L 24/19; H01L 24/20; H01L 2223/66; H01L 2223/54426; H01L 2223/54486; H01L 2224/16221; H01L 2224/32221; H01L 2224/73203; H01L 2924/14; H01L 2924/181

See application file for complete search history.

(56) References Cited

U.S. PATENT DOCUMENTS

| | | | | |
|---|---|---|---|---|
| 5,917,234 A | * | 6/1999 | Tsuruzono | ............. H01L 23/13 257/667 |
| 8,237,060 B2 | * | 8/2012 | Tanaka | ............... H01L 23/5389 174/260 |

(Continued)

FOREIGN PATENT DOCUMENTS

| | | |
|---|---|---|
| JP | 6042028 B2 | 12/2016 |
| KR | 10-2017-0112905 A | 10/2017 |

OTHER PUBLICATIONS

Office Action issued in Korean Patent Application No. 10-2017-0172321 dated Oct. 22, 2019, with English translation.

(Continued)

*Primary Examiner* — Nikolay K Yushin
(74) *Attorney, Agent, or Firm* — Sughrue Mion, PLLC

(57) ABSTRACT

A semiconductor package includes a semiconductor chip, an encapsulant encapsulating the semiconductor chip, and a connection member disposed on at least one surface of the semiconductor chip and including an insulating layer and a plurality of redistribution layers electrically connected to the semiconductor chip. At least one of the plurality of redistribution layers includes a plurality of degassing holes penetrating therethrough in a thickness direction.

18 Claims, 18 Drawing Sheets

(52) U.S. Cl.
CPC .............. *H01L 2224/73203* (2013.01); *H01L 2924/14* (2013.01); *H01L 2924/181* (2013.01)

(56) References Cited

U.S. PATENT DOCUMENTS

| | | |
|---|---|---|
| 8,710,634 B2 | 4/2014 | Chi et al. |
| 2001/0008313 A1 | 7/2001 | Wood |
| 2008/0150159 A1* | 6/2008 | Aberin .................. H01L 21/563 257/778 |
| 2009/0160071 A1 | 6/2009 | Shen |
| 2009/0244865 A1* | 10/2009 | Tanaka ................ H01L 23/5389 361/764 |
| 2017/0012008 A1 | 1/2017 | Yasooka |
| 2017/0194290 A1* | 7/2017 | Yu ....................... H01L 25/0657 |
| 2017/0178812 A1 | 9/2017 | Lee |

OTHER PUBLICATIONS

Taiwanese Office Action dated Feb. 27, 2019 issued in Taiwanese Patent Application No. 107115610 (with English translation).

* cited by examiner

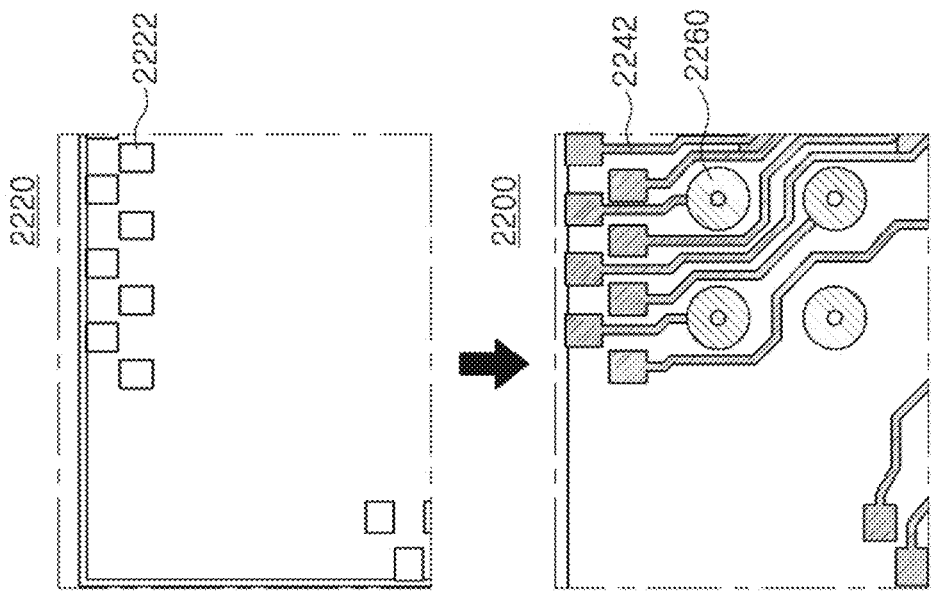
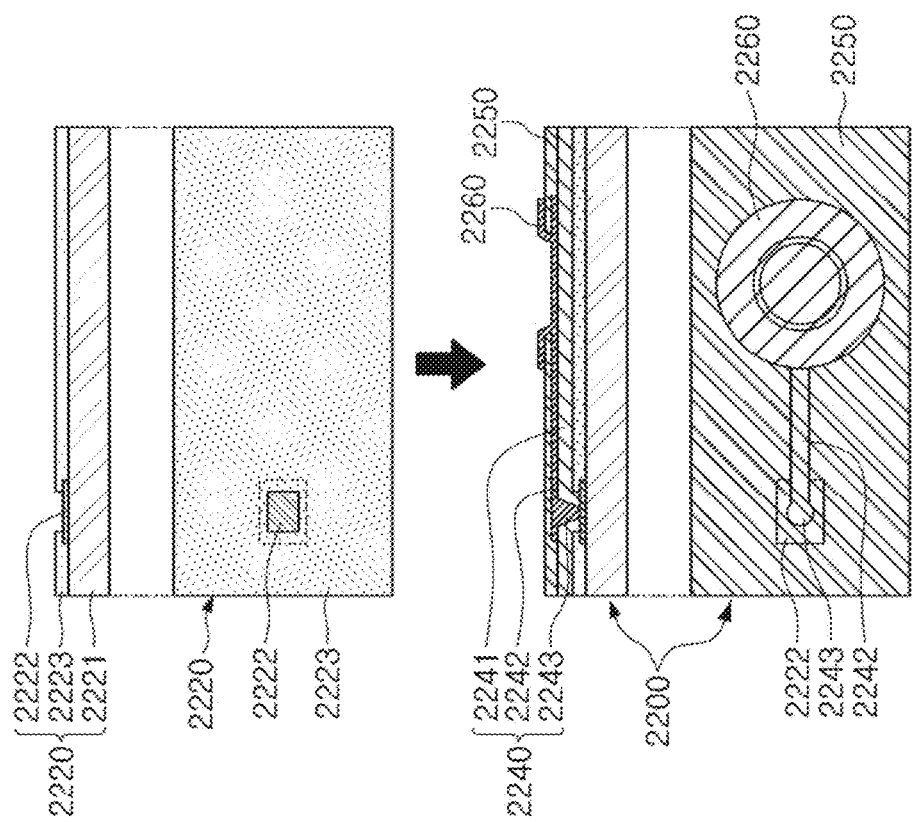
FIG. 3B
FIG. 3A

I ~ I'

FAN-OUT SEMICONDUCTOR PACKAGE

CROSS-REFERENCE TO RELATED APPLICATION(S)

This application claims benefit of priority to Korean Patent Application No. 10-2017-0172321 filed on Dec. 14, 2017 in the Korean Intellectual Property Office, the disclosure of which is incorporated herein by reference in its entirety.

TECHNICAL FIELD

The present disclosure relates to a semiconductor package, and more particularly, to a fan-out semiconductor package in which electrical connection structures may extend outwardly of a region in which a semiconductor chip is disposed.

BACKGROUND

A significant recent trend in the development of technology related to semiconductor chips has been reductions in the size of semiconductor chips. Therefore, in the field of package technology, in accordance with a rapid increase in demand for small-sized semiconductor chips, or the like, the implementation of a semiconductor package, having a compact size while including a plurality of pins, has been demanded.

One type of semiconductor package technology suggested to satisfy the technical demand, described above, is a fan-out semiconductor package. Such a fan-out package has a compact size and may allow a plurality of pins to be implemented by redistributing connection terminals outwardly of a region in which a semiconductor chip is disposed.

Meanwhile, when a wiring design of the semiconductor package is observed, ground patterns disposed in order to dissipate heat or return signals as well as signal patterns, fine circuits for transferring signals, may be confirmed. Since a copper foil retention rate in a ground region is very high, close adhesion between the ground region and an insulating layer is decreased, such that a problem such as delamination, or the like, may occur.

SUMMARY

An aspect of the present disclosure may provide a fan-out semiconductor package having a degassing hole structure capable of improving adhesion between a wiring layer and an insulating layer.

According to an aspect of the present disclosure, a semiconductor package may include: a semiconductor chip; an encapsulant encapsulating the semiconductor chip; and a connection member disposed on at least one surface of the semiconductor chip and including an insulating layer and a plurality of redistribution layers electrically connected to the semiconductor chip. At least one of the plurality of redistribution layers may include a plurality of degassing holes penetrating therethrough in a thickness direction.

The insulating layer of the connection member may be filled in the plurality of degassing holes.

The plurality of degassing holes may be arranged in a lattice structure.

The plurality of degassing holes may include a plurality of first holes, a plurality of second holes having a size smaller than that of the first holes, and a plurality of third holes having a size smaller than that of the second holes.

The second holes or the third holes may be disposed between adjacent first holes of the plurality of first holes.

The first holes may be surrounded by the second holes and the third holes.

The plurality of first to third holes may be randomly arranged.

The plurality of degassing holes may have a cylindrical shape.

The connection member may further include anchor vias connecting adjacent redistribution layers of the plurality of redistribution layers to each other.

The anchor vias may be disposed adjacent to the degassing holes.

The plurality of degassing holes included in adjacent redistribution layers of the plurality of redistribution layers may have the same shape, and may be arranged in the same positions in a plan view perpendicular to the thickness direction.

The plurality of degassing holes included in adjacent redistribution layers of the plurality of redistribution layers may have the same shape and may be arranged in staggered positions in a plan view perpendicular to the thickness direction.

In the plan view perpendicular to the thickness direction, the plurality of degassing holes included in an upper redistribution layer of the adjacent redistribution layers may be offset with respect to the plurality of degassing holes included in a lower redistribution layer of the adjacent redistribution layers.

The semiconductor package may further include a passivation layer having openings exposing portions of a lowermost one of the plurality of redistribution layers; and electrical connection structures disposed on the passivation layer and electrically connected to the exposed portions of the lowermost one of the plurality of redistribution layers. At least one of the electrical connection structures may be disposed a fan-out region.

The semiconductor package may further include a core member having a through-hole in which the semiconductor chip is disposed.

The core member may include wiring layers electrically connected to connection pads of the semiconductor chip.

The core member may include a first insulating layer in contact with the connection member, a first wiring layer in contact with the connection member and embedded in the first insulating layer, a second wiring layer disposed on another surface of the first insulating layer opposing one surface of the first insulating layer in which the first wiring layer is embedded, a second insulating layer disposed on the first insulating layer and covering the second wiring layer, and a third wiring layer disposed on the second insulating layer. The first to third wiring layers may be electrically connected to connection pads of the semiconductor chip.

The core member may include a first insulating layer, a first wiring layer and a second wiring layer disposed on opposite surfaces of the first insulating layer, respectively, a second insulating layer disposed on the first insulating layer and covering the first wiring layer, a third wiring layer disposed on the second insulating layer, a third insulating layer disposed on the first insulating layer and covering the second wiring layer, and a fourth wiring layer disposed on the third insulating layer. The first to fourth wiring layers may be electrically connected to connection pads of the semiconductor chip.

The at least one of the plurality of redistribution layers may include one integral pattern which includes portions of the plurality of degassing holes penetrating therethrough the one integral pattern.

BRIEF DESCRIPTION OF DRAWINGS

The above and other aspects, features, and advantages of the present disclosure will be more clearly understood from the following detailed description taken in conjunction with the accompanying drawings, in which:

FIGS. 3A and 3B are schematic cross-sectional views illustrating states of a fan-in semiconductor package before and after being packaged;

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

Herein, a lower side, a lower portion, a lower surface, and the like, are used to refer to a direction toward a mounting surface of the fan-out semiconductor package in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" conceptually includes a physical connection and a physical disconnection. It can be understood that when an element is referred to with terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with one another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

Electronic Device

Figure 1:
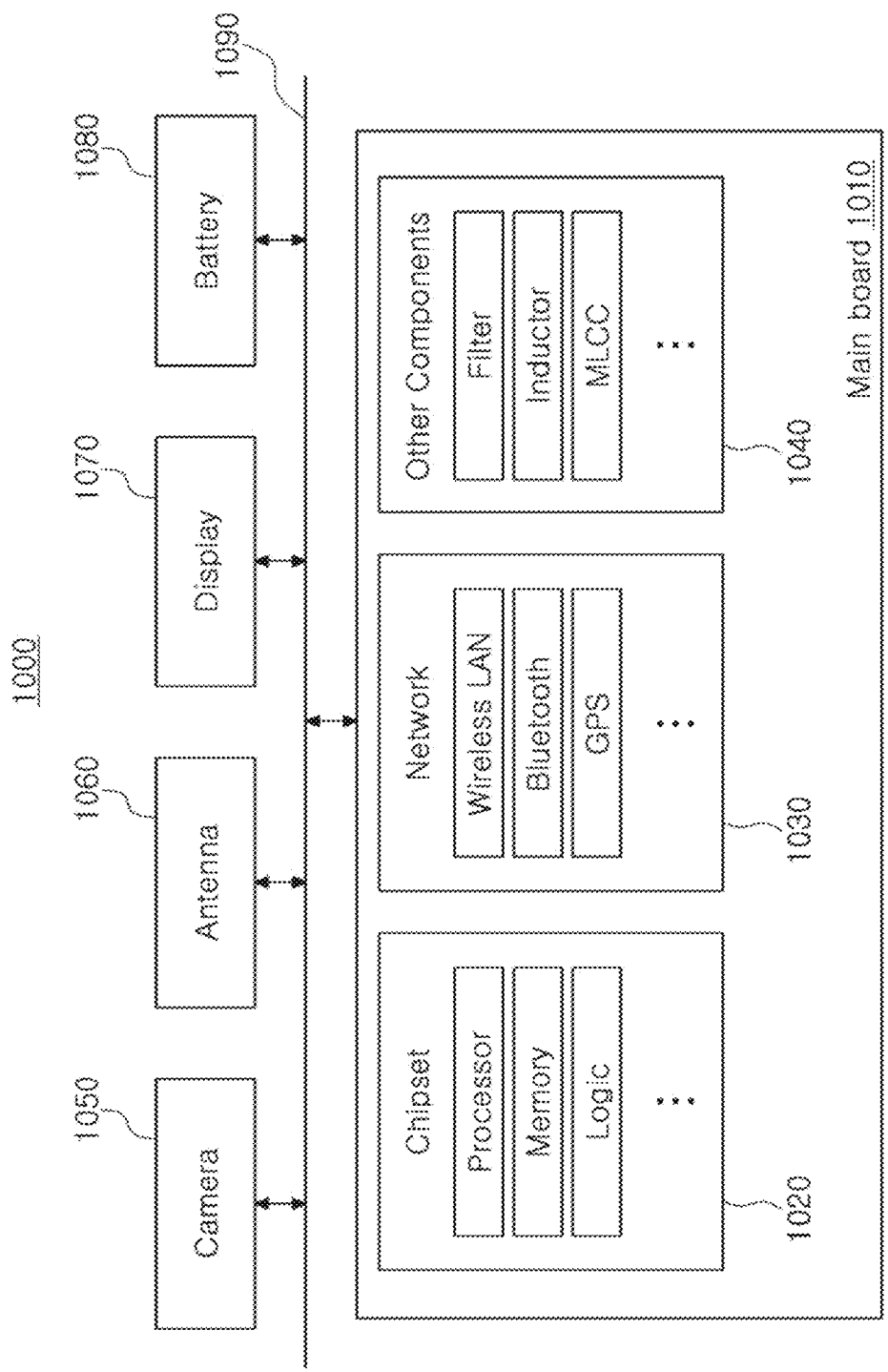
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
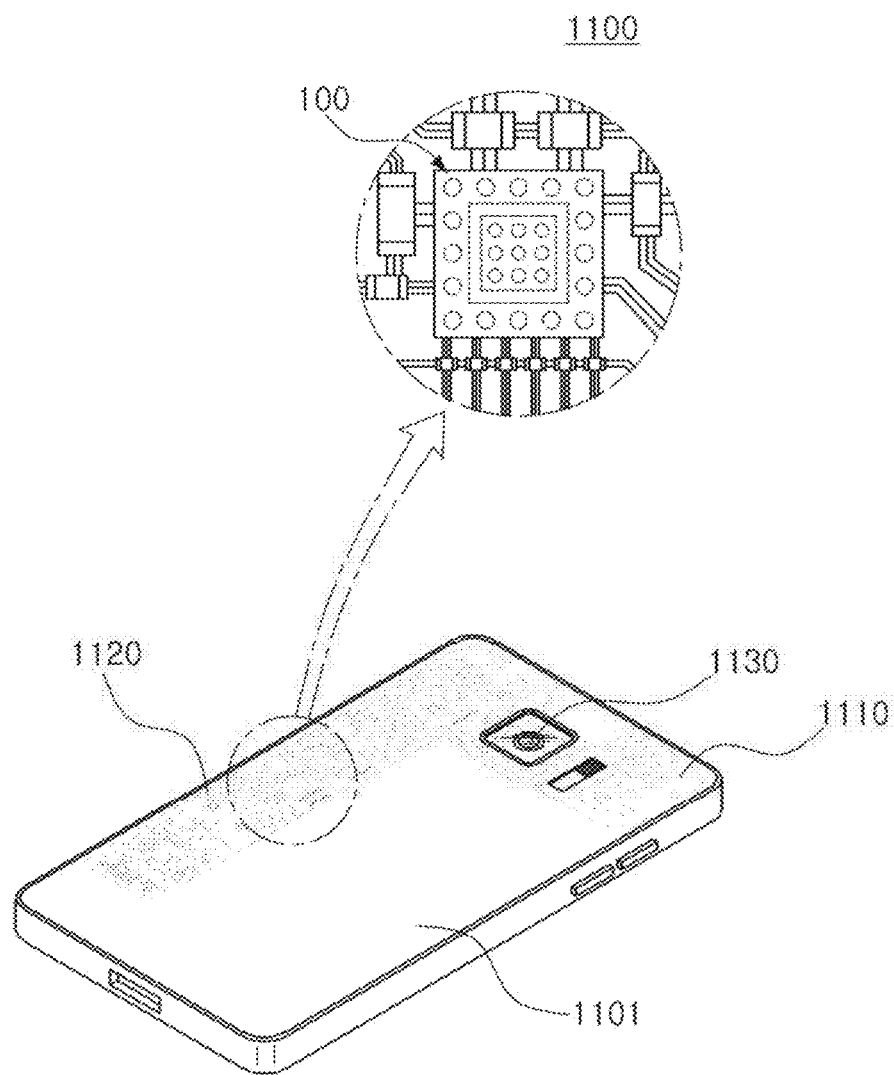
FIG. 2 is a schematic perspective view illustrating an example of an electronic device.

FIG. 2 is a schematic perspective view illustrating an example of a electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the mainboard 1010, such as a camera module 1130, may be accommodated in the body 1101. Some of the electronic components 1120 may be the chip related components, and the semiconductor package 100 may be, for example, an application processor among the chip related components, but is not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-in Semiconductor Package

FIGS. 3A and 3B are schematic cross-sectional views illustrating states of a fan-in semiconductor package before and after being packaged.

Figure 4:
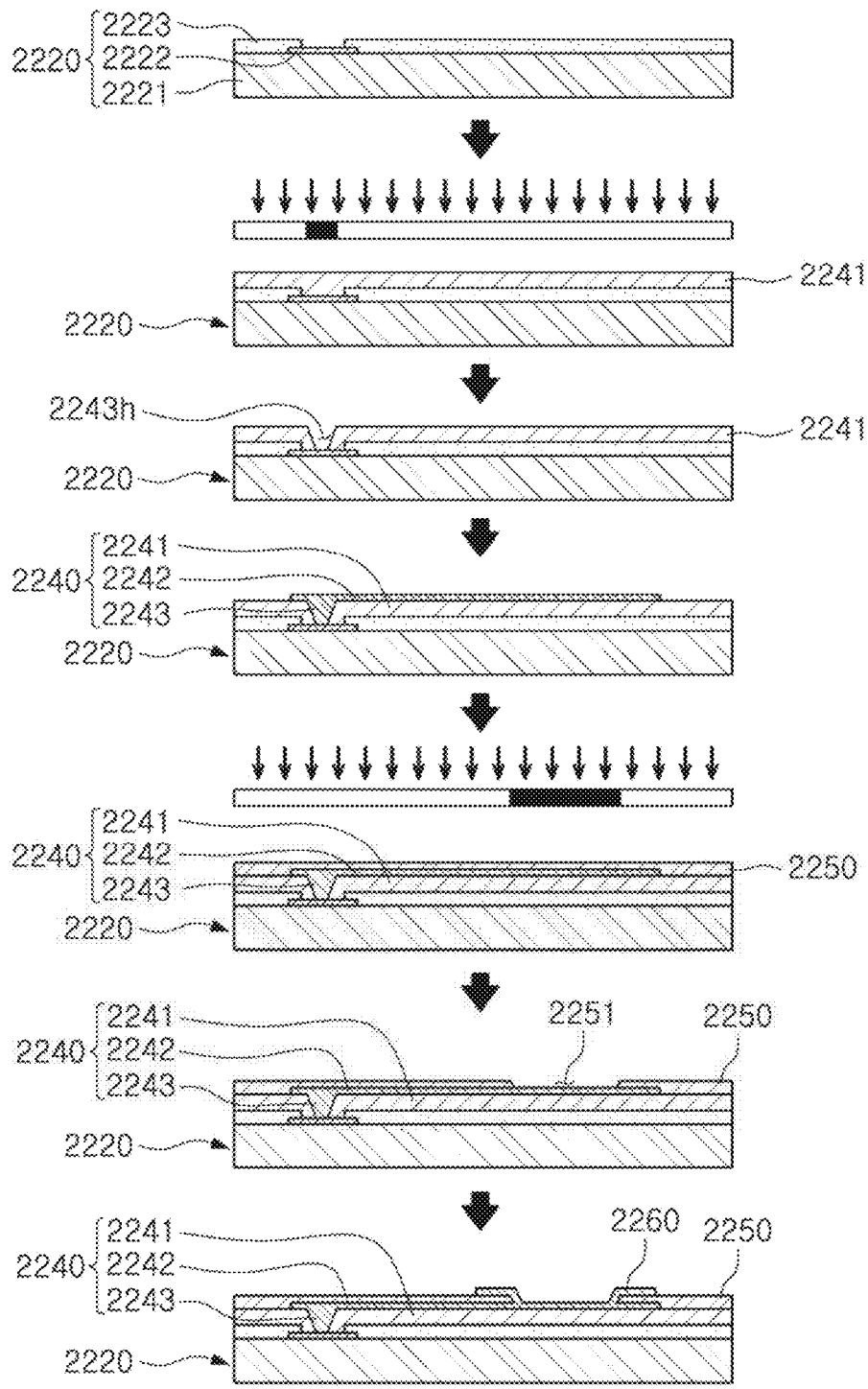
FIG. 4 is schematic cross-sectional views illustrating a packaging process of a fan-in semiconductor package.

FIG. 4 is schematic cross-sectional views illustrating a packaging process of a fan-in semiconductor package.

Referring to FIGS. 3 and 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as a photoimagable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. The reason is that even in a case in which a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the mainboard of the electronic device.

Figure 5:
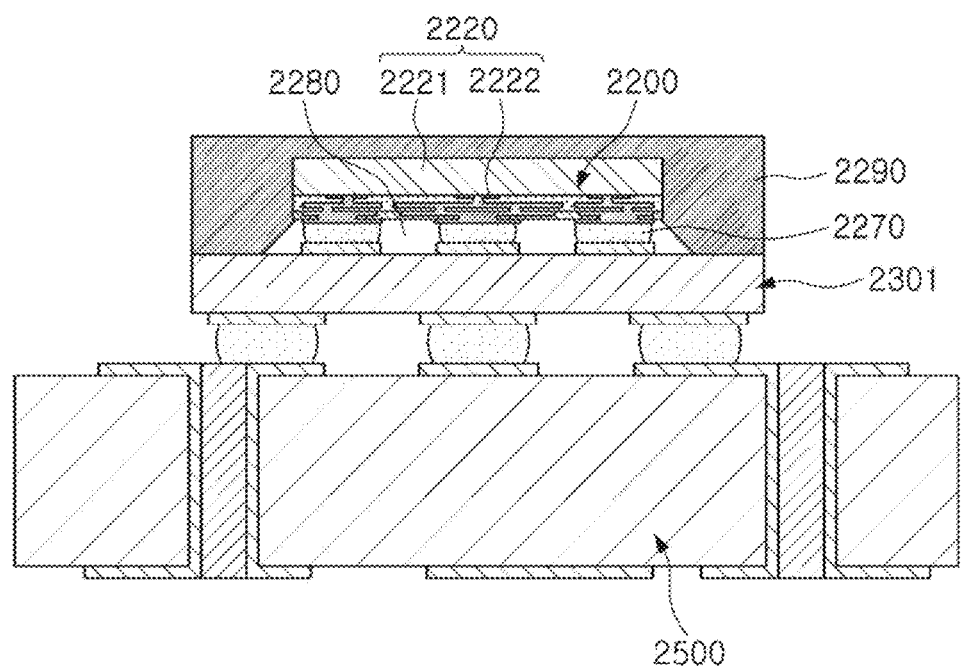
FIG. 5 is a schematic cross-sectional view illustrating a case in which a fan-in semiconductor package is mounted on an interposer substrate and is ultimately mounted on a mainboard of an electronic device.

FIG. 5 is a schematic cross-sectional view illustrating a case in which a fan-in semiconductor package is mounted on an interposer substrate and is ultimately mounted on a mainboard of an electronic device.

Figure 6:
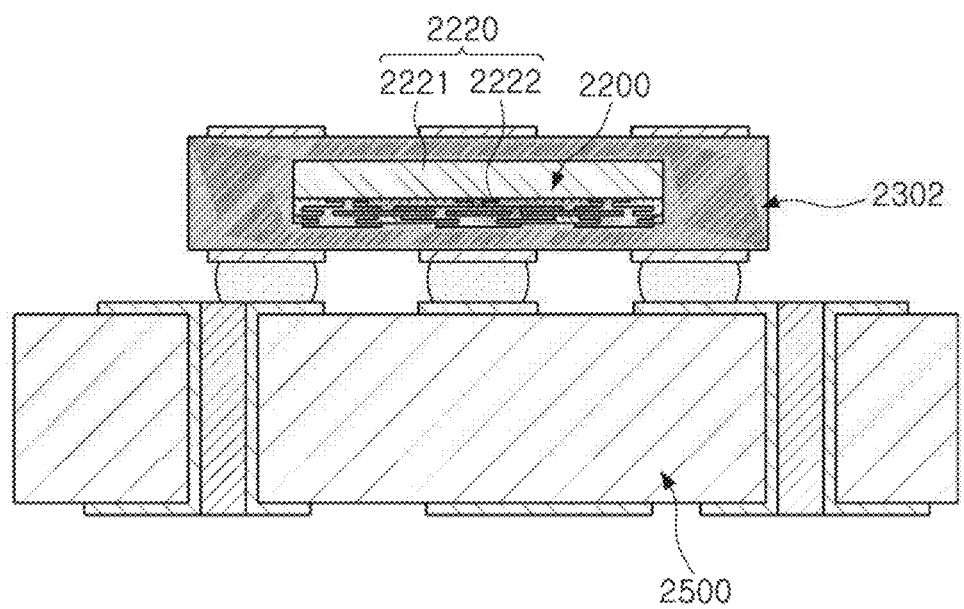
FIG. 6 is a schematic cross-sectional view illustrating a case in which a fan-in semiconductor package is embedded in an interposer substrate and is ultimately mounted on a mainboard of an electronic device.

FIG. 6 is a schematic cross-sectional view illustrating a case in which a fan-in semiconductor package is embedded in an interposer substrate and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed through an interposer substrate 2301, and the fan-in semiconductor package 2200 may be ultimately mounted on a mainboard 2500 of an electronic device in a state in which it is mounted on the interposer substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate interposer substrate 2302, connection pads 2222, that is, I/O terminals, of the semiconductor chip 2220 may be redistributed by the interposer substrate 2302 in a state in which the fan-in semiconductor package 2200 is embedded in the interposer substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate interposer substrate and be then mounted on the mainboard of the electronic device through a packaging process or may be mounted and used on the mainboard of the electronic device in a state in which it is embedded in the interposer substrate.

Fan-Out Semiconductor Package

Figure 7:
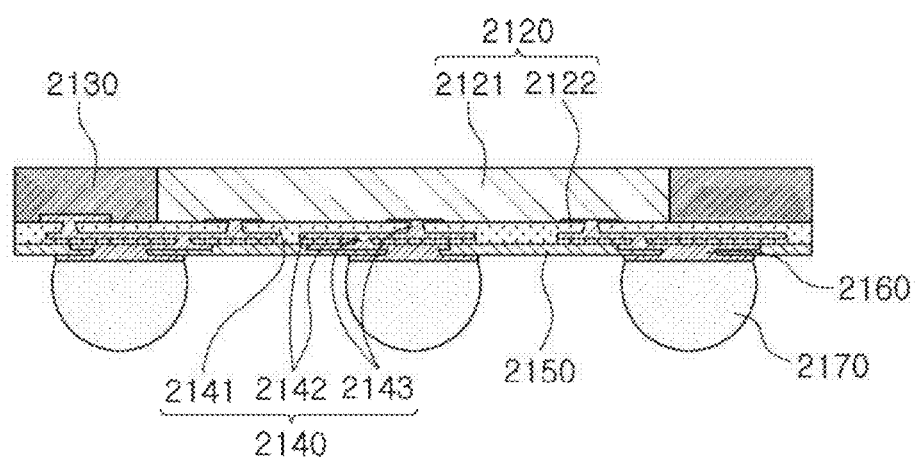
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer (not illustrated), and the like.

The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case that a size of the semiconductor chip is decreased, a standardized ball layout may be used in the fan-out semiconductor package as it is, such that the fan-out semiconductor package may be mounted on the mainboard of the electronic device without using a separate interposer substrate, as described below.

Figure 8:
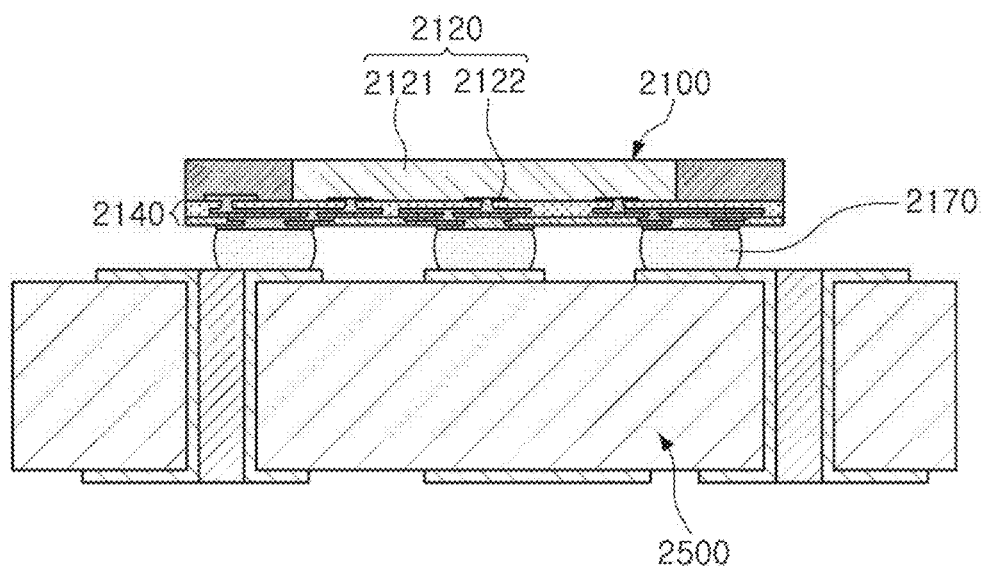
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate interposer substrate, or the like.

As described above, since the fan-out semiconductor package may be mounted on the mainboard of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

Fan-out semiconductor packages according to exemplary embodiments in the present disclosure will hereinafter be described with reference to the drawings.

Figure 9:
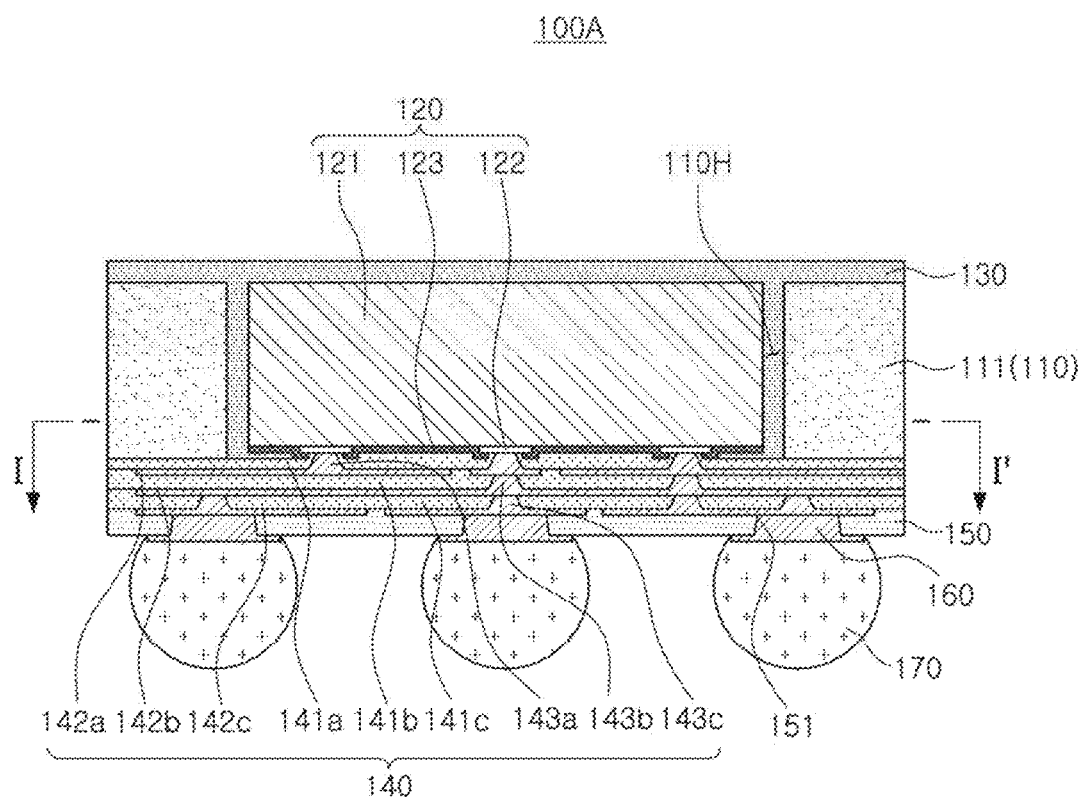
FIG. 9 is a schematic cross-sectional view illustrating an example of a fan-out semiconductor package.
Figure 10:
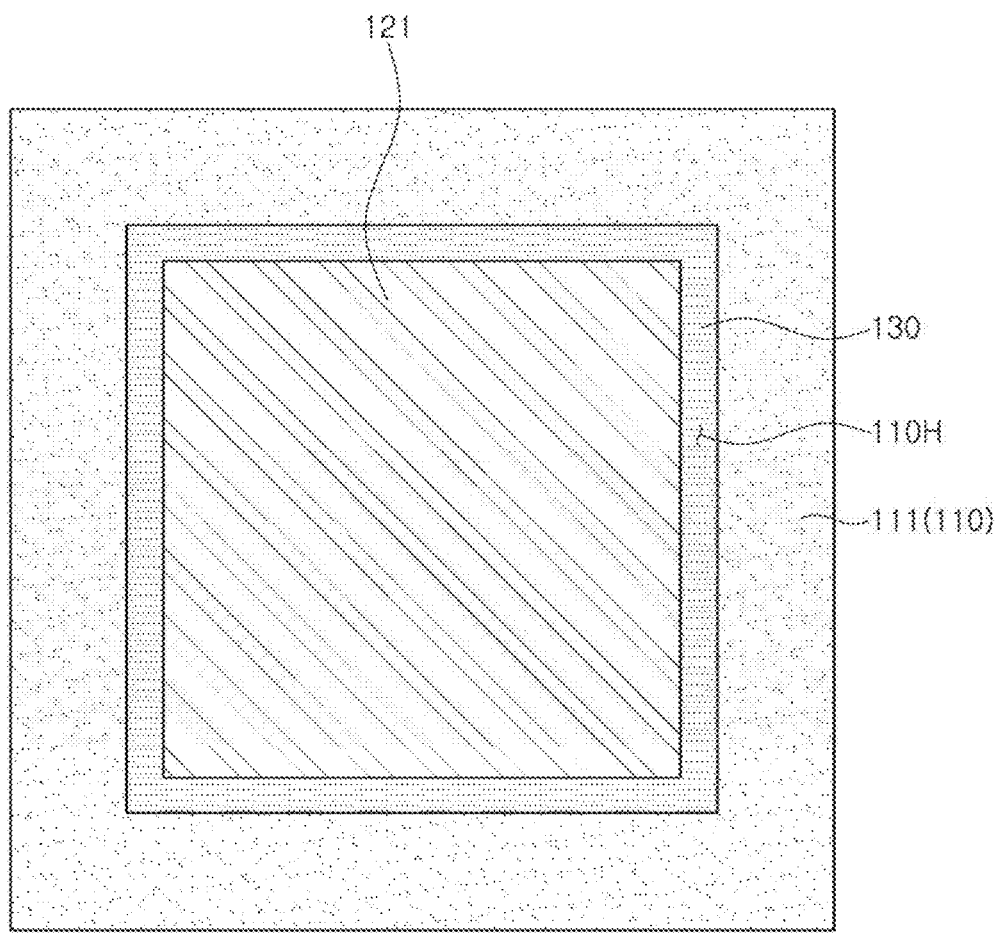
FIG. 10 is a schematic plan view taken along line I-I' of the fan-out semiconductor package of FIG. 9.
Figure 11:
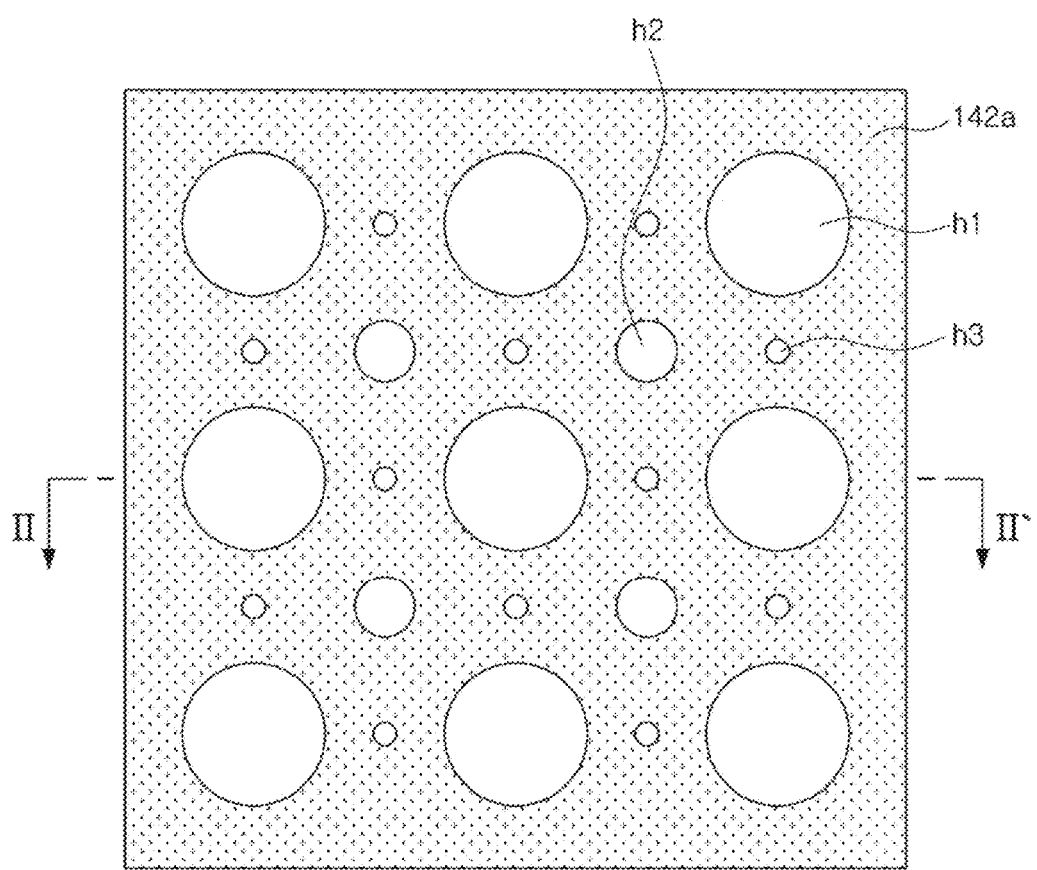
FIG. 11 is a plan view illustrating a degassing hole structure of a redistribution layer in the fan-out semiconductor package of FIG. 9.
Figure 12:
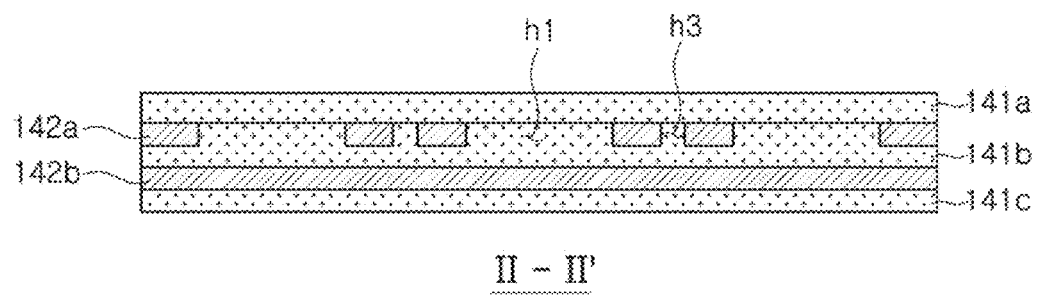
FIG. 12 is a schematic cross-sectional view taken along line II-II' of the redistribution layer of FIG. 11.

FIG. 9 is a schematic cross-sectional view illustrating an example of a fan-out semiconductor package. FIG. 10 is a schematic plan view taken along line I-I' of the fan-out semiconductor package of FIG. 9. FIG. 11 is a plan view illustrating a degassing hole structure of a redistribution layer in the fan-out semiconductor package of FIG. 9. FIG. 12 is a schematic cross-sectional view taken along line II-II' of the redistribution layer of FIG. 11.

Referring to FIGS. 9 through 12, a fan-out semiconductor package 100A according to an exemplary embodiment in the present disclosure may include a core member 110 having a through-hole 110H, a semiconductor chip 120, an encapsulant 130, and a connection member 140, and may have a form in which degassing holes h1, h2, and h3 having different sizes may be formed in at least one of a plurality of redistribution layers 142a, 142b, and 142c included in the connection member 140. In addition, the fan-out semiconductor package 100A may further include a passivation layer 150, underbump metal layers 160, electrical connection structures 170, and the like.

The core member 110 may improve rigidity of the fan-out semiconductor package 100A depending on certain materials, and serve to secure uniformity of a thickness of the encapsulant 130. When through-wirings, or the like, are formed in the core member 110 as in an exemplary embodiment to be described below, the fan-out semiconductor package 100A may be utilized as a package-on-package (POP) type package. In the present exemplary embodiment, the core member 110 may have the through-hole 110H, and the semiconductor chip 120 may be disposed in the through-hole 110H. In this case, side surfaces of the semiconductor chip 120 may be surrounded by the core member 110. However, such a form is only an example and may be variously modified to have other forms, and the core member 110 may perform another function depending on such a form. The core member 110 may be omitted, if necessary, but it may be more advantageous in securing board level reliability that the fan-out semiconductor package 100A includes the core member 110. When the fan-out semiconductor package 100A does not include the core member 110, a connection member 140 to be described below may be called a redistribution portion or a connection member.

The core member 110 may include an insulating layer 111. An insulating material may be used as a material of the insulating layer 111. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, Ajinomoto Build up Film (ABF), FR-4, Bismaleimide Triazine (BT), or the like. The core member 110 may serve as a support member.

The semiconductor chip 120 may be an integrated circuit (IC) provided in an amount of several hundred to several million or more elements integrated in a single chip. In this case, the IC may be, for example, a processor chip (more specifically, an application processor (AP)) such as a central processor (for example, a CPU), a graphic processor (for example, a GPU), a field programmable gate array (FPGA), a digital signal processor, a cryptographic processor, a micro processor, a micro controller, or the like, but is not limited thereto. That is, the IC may be a logic chip such as an analog-to-digital converter, an application-specific IC (ASIC), or the like, or a memory chip such as a volatile memory (for example, a DRAM), a non-volatile memory (for example, a ROM), a flash memory, or the like. In addition, the abovementioned elements may also be combined with each other and be disposed.

The semiconductor chip 120 may be formed on the basis of an active wafer. In this case, a base material of a body 121 may be silicon (Si), germanium (Ge), gallium arsenide (GaAs), or the like. Various circuits may be formed on the body 121. Connection pads 122 may electrically connect the semiconductor chip 120 to other components. A material of each of the connection pads 122 may be a conductive material such as aluminum (Al), or the like. A passivation layer 123 exposing the connection pads 122 may be formed on the body 121, and may be an oxide film, a nitride film, or the like, or a double layer of an oxide layer and a nitride layer. A lower surface of the connection pad 122 may have a step with respect to a lower surface of the encapsulant 130 through the passivation layer 123. Resultantly, a phenomenon in which the encapsulant 130 bleeds into the lower surface of the connection pads 122 may be prevented to some extent. An insulating layer (not illustrated), and the like, may also be further disposed in other required positions. The semiconductor chip 120 may be a bare die, a redistribution layer (not illustrated) may further be formed on an active surface of the semiconductor chip 120, if necessary, and bumps (not illustrated), or the like, may be connected to the connection pads 122. Meanwhile, an example in which one semiconductor chip 120 is used is described in the present exemplary embodiment, but the number of semiconductor chips 120 may be two or more.

The encapsulant 130 may protect the core member 110, the semiconductor chip 120, and the like. An encapsulation form of the encapsulant 130 is not particularly limited, but may be a form in which the encapsulant 130 surrounds at least portions of the core member 110, the semiconductor chip 120, and the like. For example, the encapsulant 130 may cover the core member 110 and an inactive surface of the semiconductor chip 120, and fill spaces between walls of the through-hole 110H and the side surfaces of the semiconductor chip 120. In addition, the encapsulant 130 may also fill at least a portion of a space between the passivation layer 123 of the semiconductor chip 120 and the connection member 140. Meanwhile, the encapsulant 130 may fill the through-hole 110H to thus serve as an adhesive and reduce buckling of the semiconductor chip 120 depending on certain materials.

A material of the encapsulant 130 is not particularly limited. For example, an insulating material may be used as the material of the encapsulant. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, ABF, FR-4, BT, or the like. Alternatively, a PID resin may also be used as the insulating material.

The connection member 140 may redistribute the connection pads 122 of the semiconductor chip 120. Several tens to several hundreds of connection pads 122 of the semiconductor chip 120 having various functions may be redistributed by the connection member 140, and may be physically or electrically externally connected through the electrical connection structures 170 depending on the functions. To this end, the connection member 140 may include redistribution layers 142a, 142b, and 142c. As an example, the connection member 140 may include a first insulating layer 141a disposed on the core member 110 and the active surface of the semiconductor chip 120, a first redistribution layer 142a disposed on the first insulating layer 141a, first vias 143a connecting the first redistribution layer 142a and the connection pads 122 of the semiconductor chip 120 to each other, a second insulating layer 141b disposed on the first insulating layer 141a, a second redistribution layer 142b disposed on the second insulating layer 141b, second vias 143b penetrating through the second insulating layer 141b and connecting the first and second redistribution layers 142a and 142b to each other, a third insulating layer 141c disposed on the second insulating layer 141b, a third redistribution layer 142c disposed on the third insulating layer 141c, and third vias 143c penetrating through the third insulating layer 141c and connecting the second and third redistribution layers 142b and 142c to each other. The first to third redistribution layers 142a, 142b, and 142c may be electrically connected to the connection pads 122 of the semiconductor chip 120. However, the numbers of redistribution layers 142a, 142b, 142c, insulating layers 141a, 141b, and 141c, and vias 143a, 143b, and 143c may be changed, if necessary.

For example, a photosensitive insulating material may be used as an insulating material included in each of the insulating layers 141a, 141b, and 141c. When the insulating layers 141a, 141b, and 141c have photosensitive properties, the insulating layers 141a, 141b, and 141c may be formed to have a smaller thickness, and fine pitches of the vias 143a, 143b, and 143c may be achieved more easily. The insulating layers 141a, 141b, and 141 may be photosensitive insulating layers including an insulating resin and an inorganic filler. When the insulating layers 141a, 141b, and 141c are multiple layers, the materials of the insulating layers 141a, 141b, and 141c may be the same as each other, and may also be different from each other, if necessary. When the insulating layers 141a, 141b, and 141c are the multiple layers, the insulating layers 141a, 141b, and 141c may be integrated with one another depending on a process, such that boundaries thereamong may also not be apparent. The number of insulating layers may be more than that illustrated in the drawing.

The redistribution layers 142a, 142b, and 142c may serve to substantially redistribute the connection pads 122, and may be formed of a conductive material such as copper (Cu), aluminum (Al), silver (Ag), tin (Sn), gold (Au), nickel (Ni), lead (Pb), titanium (Ti), or alloys thereof. The redistribution layers 142a, 142b, and 142c may perform various functions depending on designs of corresponding layers. For example, the redistribution layers 142a, 142b, and 142c may include ground patterns, power patterns, signal patterns, and the like. Here, the signal pattern may include various signals except for the ground pattern, the power pattern, and the like, such as data signals, and the like. In addition, the redistribution layers 142a, 142b, and 142c may include via pad patterns, connection terminal pad patterns, and the like.

The vias 143a, 143b, and 143c may electrically connect the redistribution layers 142a, 142b, and 142c, the connection pads 122, and the like, formed on different layers to each other, resulting in an electrical path in the fan-out semiconductor package 100A. A material of each of the vias 143a, 143b, and 143c may be a conductive material such as copper (Cu), aluminum (Al), silver (Ag), tin (Sn), gold (Au), nickel (Ni), lead (Pb), titanium (Ti), or alloys thereof. Each of the vias 143a, 143b, and 143c may be completely filled with the conductive material, or the conductive material may also be formed along a wall of each of the vias. In addition, each of the vias 143a, 143b, and 143c may have any shape known in the related art, such as a tapered shape, a cylindrical shape, and the like.

In the present exemplary embodiment, as illustrated in FIGS. 11 and 12, at least one of the plurality of redistribution layers 142a, 142b, and 142c may include a plurality of degassing holes h1, h2, and h3 penetrating therethrough in a thickness direction. An example in which the degassing holes h1, h2, and h3 are formed in only one redistribution layer 142a is described in the present exemplary embodiment, but the other redistribution layers 142b and 142c may also include degassing holes. The degassing holes h1, h2, and h3 may be formed in the redistribution layer 142a to improve close adhesion between the insulating layers 141a, 141b, and 141c and the redistribution layer 142a and easily discharge a gas component, or the like. Further, in the present exemplary embodiment, three kinds of degassing holes h1, h2, and h3 having different sizes may be formed. Therefore, a large number of degassing holes h1, h2, and h3 may be formed in a limited space, and a disposition manner of the degassing holes h1, h2, and h3 may be appropriately designed, if necessary. The plurality of degassing holes h1, h2, and h3 will hereinafter be referred to as first to third holes h1, h2, and h3. However, unlike the present exemplary embodiment, four or more kinds of degassing holes may also be used. Meanwhile, the degassing holes h1, h2, and h3 may be effectively applied to the ground patterns having a copper foil retention rate in the redistribution layer 142a. However, the degassing holes h1, h2, and h3 may also be applied to the signal patterns, the power patterns, or the like, in addition to the ground patterns. The degassing holes h1, h2, and h3 may be formed in one integral pattern of a respective one of the plurality of redistribution layers 142a, 142b, and 142c. That is, edges of the degassing holes h1, h2, and h3 are inner boundaries of the one integral pattern, and the degassing holes h1, h2, and h3 may be located within outer boundaries of the one integral pattern. Although not shown, the plurality of redistribution layers 142a, 142b, and 142c may additional include one or more integral patterns, each of which includes holes similar to the degassing holes h1, h2, and h3.

As described above, the plurality of degassing holes may include a plurality of first holes h1, a plurality of second holes h2 having a size smaller than that of the first holes h1, and a plurality of third holes h3 having a size smaller than that of the second holes h2. In addition, as illustrated in FIG. 12, the insulating layers 141a, 141b, and 141c may be filled in the plurality of first to third holes h1, h2, and h3, such that coupling force between the insulating layers 141a, 141b, and 141c and the redistribution layers 142a, 142b, and 142c may be improved. In addition, a depression phenomenon of the insulating layers may be decreased in a case of using degassing holes h1, h2, and h3 having various sizes as compared to a case of using one kind of holes having a large size. In addition, process efficiency may be secured used as compared to a case of using one kind of holes having a small size. In this case, at the time of forming the degassing holes h1, h2, and h3 in the redistribution layer 142a, the first holes h1 having the largest size may be formed, and the second holes h2 and the third holes h3 may then be formed in empty places.

A manner of arranging the degassing holes h1, h2, and h3 will be described. As illustrated in FIG. 11, the plurality of first to third holes h1, h2, and h3 may be arranged in a lattice structure, respectively. In this case, the first to third holes h1, h2, and h3 may have a cylindrical shape. However, a shape of each of the first to third holes h1, h2, and h3 may be appropriately modified. When the first to third holes h1, h2, and h3 have the cylindrical shape, the first holes h1 may have a diameter of about 30 μm to 40 μm, the second holes h2 may have a diameter of about 20 μm to 30 μm, and the third holes h3 may have a diameter of about 10 μm to 20 μm.

Figure 13:
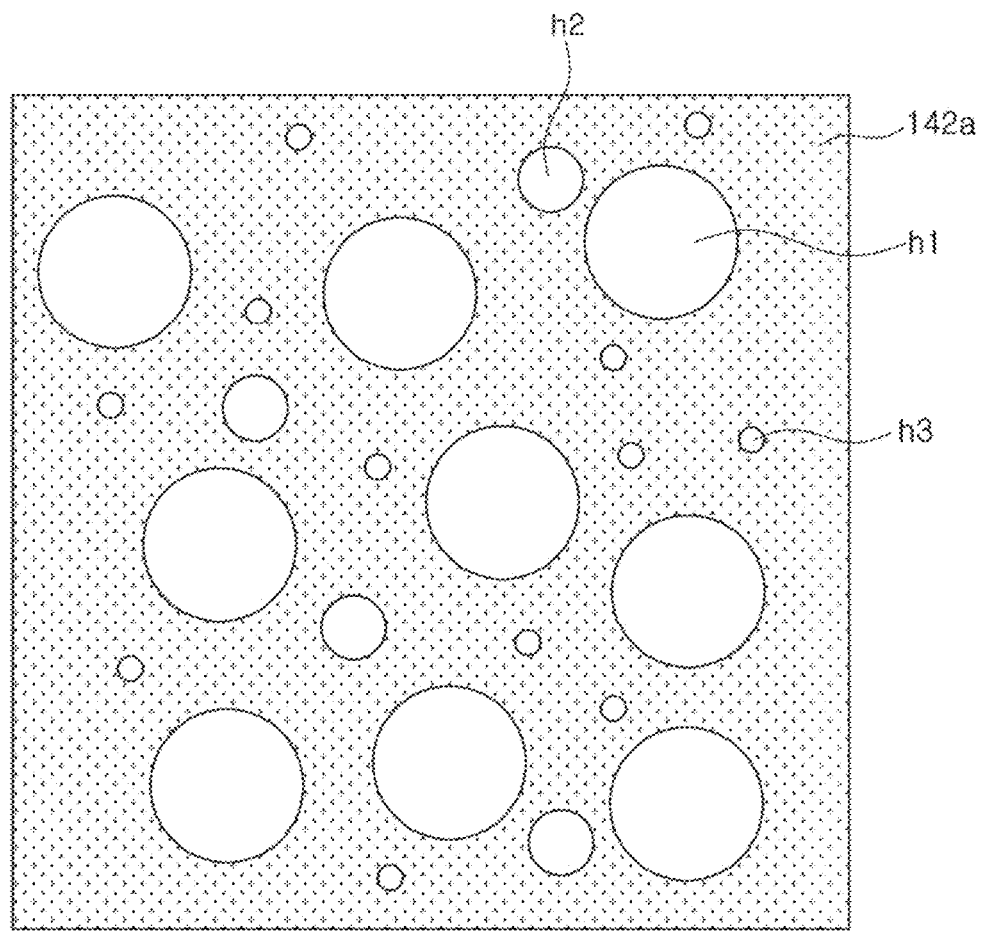
FIGS. 13 through 16 are schematic views illustrating redistribution layers in fan-out semiconductor packages according to modified exemplary embodiments.

In order to efficiently arrange the degassing holes h1, h2, and h3, the second holes h2 or the third holes h3 may be disposed between adjacent first holes h1 of the plurality of first holes h1. In addition, the first holes h1 may be surrounded by the second holes h2 and the third holes h3. As described above, the first to third holes h1, h2, and h3 having the different sizes may be regularly arranged. Alternatively, as in a modified example of FIG. 13, the plurality of first to third holes h1, h2, and h3 may be randomly arranged. Here, the random arrangement means that intervals, arranging directions, or the like, of the first to third holes h1, h2, and h3 are random.

Other components will be described again with reference to FIG. 9. The passivation layer 150 may protect the connection member 140 from external physical or chemical damage. The passivation layer 150 may have openings 151 exposing at least portions of the redistribution layers 142a, 142b, 142c of the connection member 140. The number of openings 151 formed in the passivation layer 150 may be several tens to several thousands. A material of the passivation layer 150 is not particularly limited. For example, an insulating material may be used as the material of the passivation layer 150. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, ABF, FR-4, BT, or the like. Alternatively, a solder resist may also be used.

The underbump metal layers 160 may improve connection reliability of the electrical connection structures 170 to improve board level reliability of the fan-out semiconductor package 100A. The underbump metal layers 160 may be connected to the redistribution layers 142a, 142b, and 142c of the connection member 140 exposed through the openings 151 of the passivation layer 150. The underbump metal layers 160 may be formed in the openings 151 of the passivation layer 150 by any known metallization method using any known conductive metal such as a metal, but are not limited thereto.

The electrical connection structures 170 may physically or electrically externally connect the fan-out semiconductor package 100A. For example, the fan-out semiconductor package 100A may be mounted on the mainboard of the electronic device through the electrical connection structures 170. Each of the electrical connection structures 170 may be formed of a conductive material, for example, a solder, or the like. However, this is only an example, and a material of each of the electrical connection structures 170 is not particularly limited thereto. Each of the electrical connection structures 170 may be a land, a ball, a pin, or the like. The electrical connection structures 170 may be formed as a multilayer or single layer structure. When the electrical connection structures 170 are formed as a multilayer structure, the electrical connection structures 170 may include a copper (Cu) pillar and a solder. When the electrical connection structures 170 are formed as a single layer structure, the electrical connection structures 170 may include a tin-silver solder or copper (Cu). However, this is only an example, and the electrical connection structures 170 are not limited thereto.

The number, an interval, a disposition form, and the like, of electrical connection structures 170 are not particularly limited, but may be sufficiently modified depending on design particulars by those skilled in the art. For example, the electrical connection structures 170 may be provided in an amount of several tens to several thousands according to the number of connection pads 122, or may be provided in an amount of several tens to several thousands or more or several tens to several thousands or less. When the electrical connection structures 170 are solder balls, the electrical connection structures 170 may cover side surfaces of the underbump metal layers 160 extending onto one surface of the passivation layer 150, and connection reliability may be more excellent.

At least one of the electrical connection structures 170 may be disposed in a fan-out region. The fan-out region refers to a region except for a region in which the semiconductor chip 120 is disposed. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be manufactured to have a small thickness, and may have price competitiveness.

Meanwhile, although not illustrated in the drawings, a metal thin film may be formed on the walls of the through-hole 110H, if necessary, in order to dissipate heat or block electromagnetic waves. In addition, a plurality of semiconductor chips 120 performing functions that are the same as or different from each other may be disposed in the through-hole 110H, if necessary. In addition, a separate passive component such as an inductor, a capacitor, or the like, may be disposed in the through-hole 110H, if necessary. In addition, a passive component, for example, a surface mounting technology (SMT) component including an inductor, a capacitor, or the like, may be disposed on a surface of the passivation layer 150, if necessary.

Figure 14:
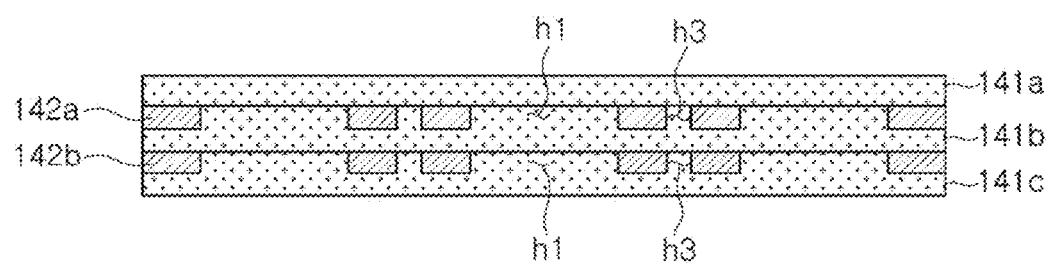

Other modified examples will be described with reference to FIGS. 14 through 16. First, in a modified example of FIG. 14, degassing holes h1, h2, and h3 may be formed in a plurality of redistribution layers 142a and 142b, and a plurality of degassing holes h1, h2, and h3 included in adjacent redistribution layers 142a and 142b may have the same shape, and may be arranged in the same positions.

Figure 15:
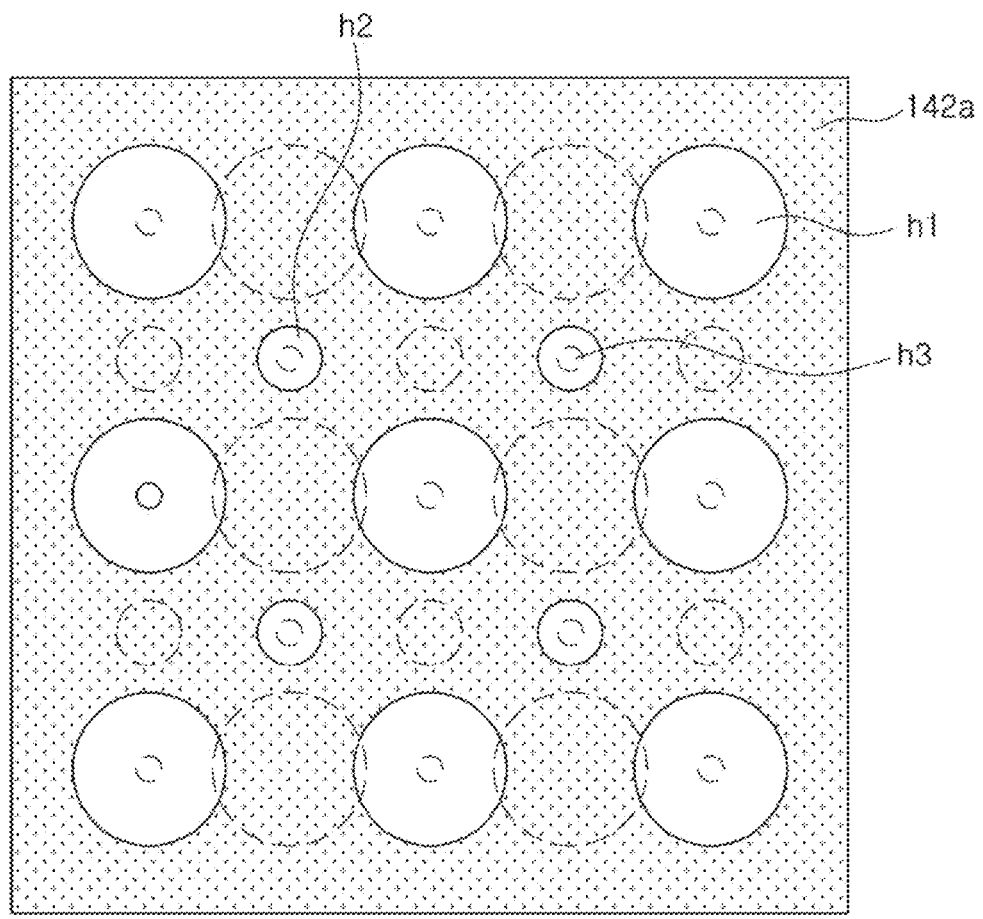

Alternatively, in a modified example of FIG. 15, a plurality of degassing holes h1, h2, and h3 included in adjacent redistribution layers 142a and 142b of a plurality of redistribution layers may have the same shape, but may be arranged in staggered positions. In detail, the plurality of degassing holes h1, h2, and h3 included in an upper redistribution layer 142a of the adjacent redistribution layers 142a and 142b may be arranged to be shifted in a lateral direction with respect to the plurality of degassing holes h1, h2, and h3 included in a lower redistribution layer 142b of the adjacent redistribution layers 142a and 142b. In FIG. 15, degassing holes h1, h2, and h3 denoted by a solid line may correspond to the degassing holes h1, h2, and h3 included in the upper redistribution layer 142a, and degassing holes h1, h2, and h3 denoted by a dotted line may correspond to the degassing holes h1, h2, and h3 included in the lower redistribution layer 142b. In the present modified example, areas of the degassing holes h1, h2, and h3 overlapping each other in a vertical direction are significantly decreased, and a depression phenomenon of the insulating layers 141a, 141b, and 141c may thus be decreased.

Figure 16:
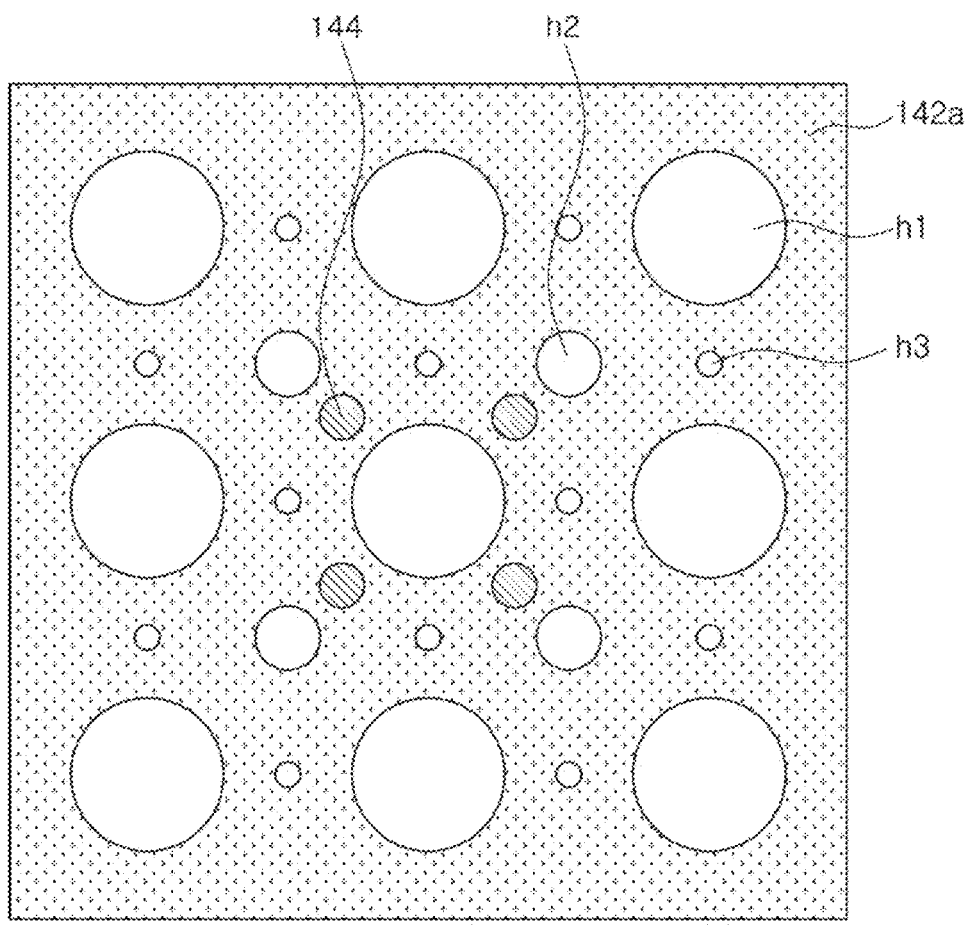

In a modified example of FIG. 16, anchor vias may be used in order to further improve structural stability of the fan-out semiconductor package. In detail, the anchor vias 144 may connect adjacent redistribution layers of a plurality of redistribution layers 142a, 142b, and 142c to each other, and may be formed of the same material as that of each of the vias 143a, 143b, and 143c described above. The anchor vias 144 may be disposed adjacent to degassing holes h1, h2, and h3, as illustrated in FIG. 16. Coupling force between the redistribution layers 142a, 142b, and 142c may be increased by using the anchor vias, in addition to the degassing holes h1, h2, and h3, and structural stability of the fan-out semiconductor package may thus be further improved.

Figure 17:
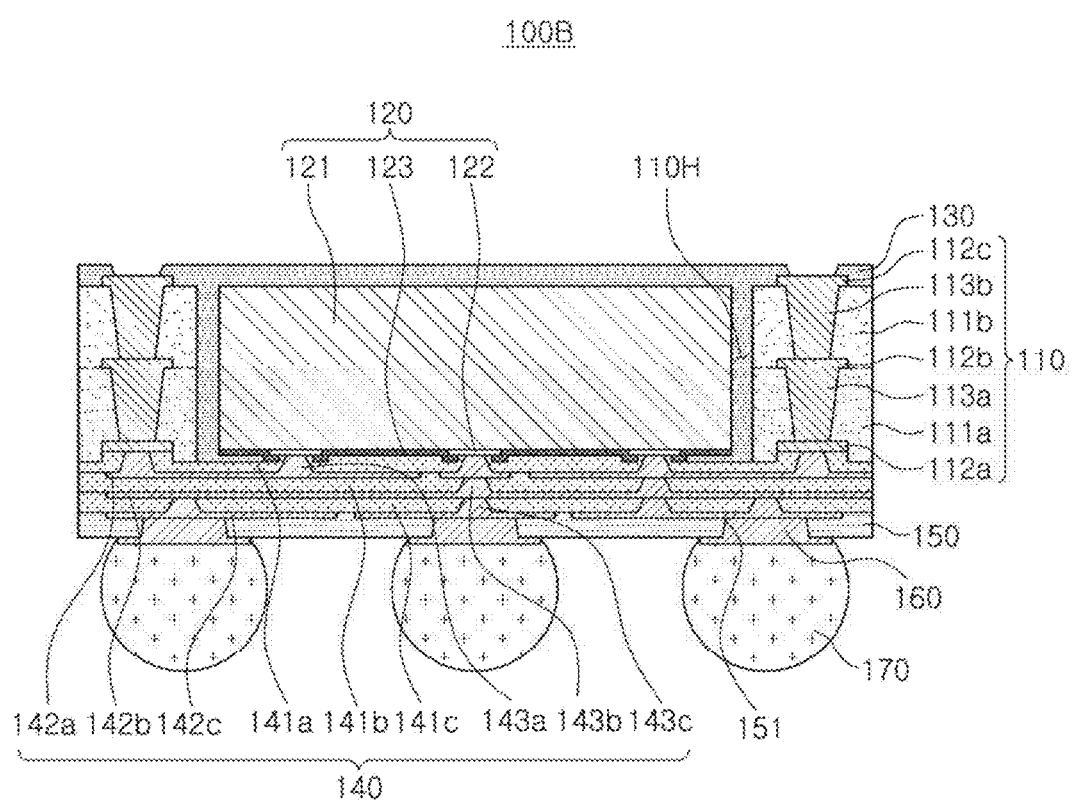
FIGS. 17 and 18 are cross-sectional views illustrating other examples of a fan-out semiconductor package.
Figure 18:
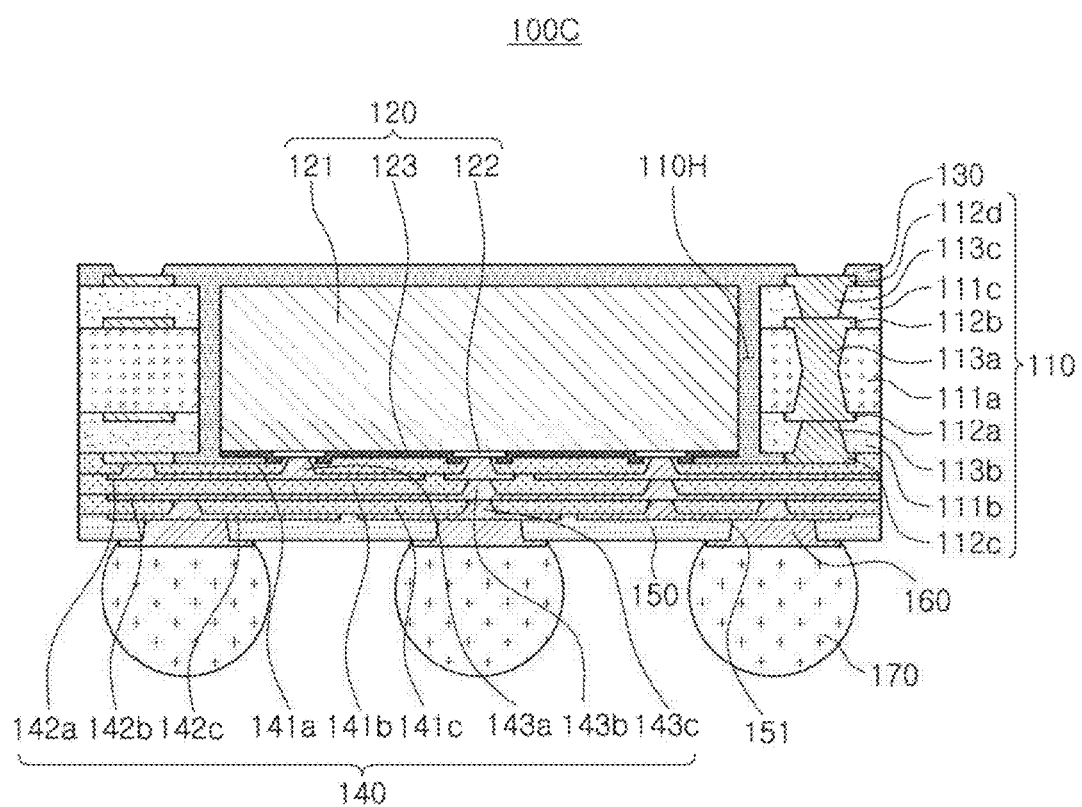

Meanwhile, as illustrated in FIGS. 17 and 18, conductive vias serving as an interlayer electrical conduction function may be installed in a core member to penetrate through the core member. First, in a fan-out semiconductor package 100B according to another exemplary embodiment in the present disclosure illustrated in FIG. 17, a plurality of conductive vias serving as an interlayer electrical conduction function may be installed in a core member 110. In detail, the core member 110 may include a first insulating layer 111a in contact with a connection member 140, a first wiring layer 112a in contact with the connection member 140 and embedded in the first insulating layer 111a, a second wiring layer 112b disposed on the other surface of the first insulating layer 111a opposing one surface of the first insulating layer 111a in which the first wiring layer 112a is embedded, a second insulating layer 111b disposed on the first insulating layer 111a and covering the second wiring layer 112b, and a third wiring layer 112c disposed on the second insulating layer 111b. The first to third wiring layers 112a, 112b, and 112c may be electrically connected to connection pads 122. The first and second wiring layers 112a and 112b and the second and third wiring layers 112b and 112c may be electrically connected to each other through first and second vias 113a and 113b penetrating through the first and second insulating layers 111a and 111b, respectively.

When the first wiring layer 112a is embedded in the first insulating layer 111a, a step generated due to a thickness of the first wiring layer 112a may be significantly reduced, and an insulating distance of the connection member 140 may thus become constant. That is, a difference between a distance from a first redistribution layer 142a of the connection member 140 to a lower surface of the first insulating layer 111a and a distance from the first redistribution layer 142a of the connection member 140 to the connection pad 122 of a semiconductor chip 120 may be smaller than a thickness of the first wiring layer 112a. Therefore, a high density wiring design of the connection member 140 may be easy.

As illustrated in FIG. 17, a lower surface of the first wiring layer 112a of the core member 110 may be disposed on a level above a lower surface of the connection pad 122 of the semiconductor chip 120. In addition, a distance between the first redistribution layer 142a of the connection member 140 and the first wiring layer 112a of the core member 110 may be greater than that between the first redistribution layer 142a of the connection member 140 and the connection pad 122 of the semiconductor chip 120. The reason is that the first wiring layer 112a may be recessed into the first insulating layer 111a. As described above, when the first wiring layer 112a is recessed into the first insulating layer 111a, such that the lower surface of the first insulating layer 111a and the lower surface of the first wiring layer 112a have a step therebetween, a phenomenon in which a material of an encapsulant 130 bleeds to pollute the first wiring layer 112a may be prevented. The second wiring layer 112b of the core member 110 may be disposed on a level between an active surface and an inactive surface of the semiconductor chip 120. The core member 110 may be formed at a thickness corresponding to that of the semiconductor chip 120. Therefore, the second wiring layer 112b formed in the core member 110 may be disposed on the level between the active surface and the inactive surface of the semiconductor chip 120.

Thicknesses of the wiring layers 112a, 112b, and 112c of the core member 110 may be greater than those of redistribution layers 142a, 142b, and 142c of the connection member 140. Since the core member 110 may have a thickness equal to or greater than that of the semiconductor chip 120, the wiring layers 112a, 112b, and 112c may be formed to have large sizes depending on a scale of the core member 110. On the other hand, the redistribution layers 142a, 142b, 142c of the connection member 140 may be formed to have sizes relatively smaller than those of the wiring layers 112a, 112b, and 112c for thinness.

A material of each of the insulating layers 111a and 111b is not particularly limited. For example, an insulating material may be used as the material of each of the insulating layers 111a and 111b. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, ABF, FR-4, BT, or the like. Alternatively, a PID resin may also be used as the insulating material.

The wiring layers 112a, 112b, and 112c may serve to redistribute the connection pads 122 of the semiconductor chip 120. A material of each of the wiring layers 112a, 112b, and 112c may be a conductive material such as copper (Cu), aluminum (Al), silver (Ag), tin (Sn), gold (Au), nickel (Ni), lead (Pb), titanium (Ti), or alloys thereof. The wiring layers 112a, 112b, and 112c may perform various functions depending on designs of corresponding layers. For example, the wiring layers 112a, 112b, and 112c may include ground patterns, power patterns, signal patterns, and the like. Here, the signal pattern may include various signals except for the ground pattern, the power pattern, and the like, such as data signals, and the like. In addition, the wiring layers 112a, 112b, and 112c may include via pads, wire pads, connection terminal pads, and the like.

The vias 113a and 113b may electrically connect the wiring layers 112a, 112b, and 112c formed on different layers to each other, resulting in an electrical path in the core member 110. A material of each of the vias 113a and 113b may be a conductive material. Each of the vias 113a and 113b may be completely filled with a conductive material, or a conductive material may also be formed along a wall of each of via holes. In addition, each of the vias 113a and 113b may have any shape known in the related art, such as a tapered shape, a cylindrical shape, and the like. When holes for the first vias 113a are formed, some of the pads of the first wiring layer 112a may serve as a stopper, and it may thus be advantageous in a process that each of the first vias 113a has the tapered shape of which a width of an upper surface is greater than that of a lower surface. In this case, the first vias 113a may be integrated with pad patterns of the second wiring layer 112b. In addition, when holes for the second vias 113b are formed, some of the pads of the second wiring layer 112b may serve as a stopper, and it may thus be advantageous in a process that each of the second vias 113b has the tapered shape of which a width of an upper surface is greater than that of a lower surface. In this case, the second vias 113b may be integrated with pad patterns of the third wiring layer 112c.

Next, a fan-out semiconductor package 100C according to another exemplary embodiment in the present disclosure illustrated in FIG. 18 will be described. In the fan-out semiconductor package 100C, a core member 110 may include a first insulating layer 111a, a first wiring layer 112a and a second wiring layer 112b disposed on opposite surfaces of the first insulating layer 111a, respectively, a second insulating layer 111b disposed on the first insulating layer 111a and covering the first wiring layer 112a, a third wiring layer 112c disposed on the second insulating layer 111b, a third insulating layer 111c disposed on the first insulating layer 111a and covering the second wiring layer 112b, and a fourth wiring layer 112d disposed on the third insulating layer 111c. The first to fourth wiring layers 112a, 112b, 112c, and 112d may be electrically connected to connection pads 122. Since the core member 110 may include a larger number of wiring layers 112a, 112b, 112c, and 112d, a connection member 140 may further be simplified. Therefore, a decrease in a yield depending on a defect occurring in a process of forming the connection member 140 may be suppressed. Meanwhile, the first to fourth wiring layers 112a, 112b, 112c, and 112d may be electrically connected to each other through first to third vias 113a, 113b, and 113c respectively penetrating through the first to third insulating layers 111a, 111b, and 111c.

The first insulating layer 111a may have a thickness greater than those of the second insulating layer 111b and the third insulating layer 111c. The first insulating layer 111a may be basically relatively thick in order to maintain rigidity, and the second insulating layer 111b and the third insulating layer 111c may be introduced in order to form a larger number of wiring layers 112c and 112d. The first insulating layer 111a may include an insulating material different from those of the second insulating layer 111b and the third insulating layer 111c. For example, the first insulating layer 111a may be, for example, prepreg including a core material, a filler, and an insulating resin, and the second insulating layer 111b and the third insulating layer 111c may be an ABF or a PID film including a filler and an insulating resin. However, the materials of the first insulating layer 111a and the second and third insulating layers 111b and 111c are not limited thereto. Similarly, the first vias 113a penetrating through the first insulating layer 111a may have a diameter greater than those of second vias 113b and third vias 113c respectively penetrating through the second insulating layer 111b and the third insulating layer 111c.

A lower surface of the third wiring layer 112c of the core member 110 may be disposed on a level below a lower surface of the connection pad 122 of a semiconductor chip 120. In addition, a distance between a first redistribution layer 142a of the connection member 140 and the third wiring layer 112c of the core member 110 may be smaller than that between the first redistribution layer 142a of the connection member 140 and the connection pad 122 of the semiconductor chip 120. The reason is that the third wiring layer 112c may be disposed on the second insulating layer 111b in a protruding form, resulting in being in contact with the connection member 140. The first wiring layer 112a and the second wiring layer 112b of the core member 110 may be disposed on a level between an active surface and an inactive surface of the semiconductor chip 120. Since the core member 110 may be formed at a thickness corresponding to that of the semiconductor chip 120, the first wiring layer 112a and the second wiring layer 112b formed in the core member 110 may be disposed on the level between the active surface and the inactive surface of the semiconductor chip 120.

Thicknesses of the wiring layers 112a, 112b, 112c, and 112d of the core member 110 may be greater than those of redistribution layers 142a, 142b, and 142c of the connection member 140. Since the core member 110 may have a thickness equal to or greater than that of the semiconductor chip 120, the wiring layers 112a, 112b, 112c, and 112d may also be formed to have large sizes. On the other hand, the redistribution layers 142a, 142b, and 142c of the connection member 140 may be formed to have relatively small sizes for thinness.

Other configurations, for example, contents described with reference to FIGS. 9 through 16 may be applied to the semiconductor packages 100B and 100C according to other exemplary embodiment, and a detailed description thereof overlaps that described above, and is thus omitted.

As set forth above, according to the exemplary embodiments in the present disclosure, a fan-out semiconductor package having a degassing hole structure capable of improving adhesion between a wiring layer and an insulating layer may be provided.

While exemplary embodiments have been shown and described above, it will be apparent to those skilled in the art that modifications and variations could be made without departing from the scope of the present invention as defined by the appended claims.

What is claimed is:

1. A semiconductor package comprising:
a semiconductor chip;
an encapsulant encapsulating the semiconductor chip; and
a connection member disposed on at least one surface of the semiconductor chip and including an insulating layer and a plurality of redistribution layers electrically connected to the semiconductor chip,
wherein at least one of the plurality of redistribution layers includes a plurality of degassing holes penetrating therethrough in a thickness direction, and
the plurality of degassing holes include a plurality of first holes, a plurality of second holes having a size smaller than that of the first holes, and a plurality of third holes having a size smaller than that of the second holes.

2. The semiconductor package of claim 1, wherein the insulating layer of the connection member is filled in the plurality of degassing holes.

3. The semiconductor package of claim 1, wherein the plurality of degassing holes are arranged in a lattice structure.

4. The semiconductor package of claim 1, wherein the second holes or the third holes are disposed between adjacent first holes of the plurality of first holes.

5. The semiconductor package of claim 1, wherein the first holes are surrounded by the second holes and the third holes.

6. The semiconductor package of claim 1, wherein the plurality of first to third holes are randomly arranged.

7. The semiconductor package of claim 1, wherein the plurality of degassing holes have a cylindrical shape.

8. The semiconductor package of claim 1, wherein the plurality of degassing holes included in adjacent redistribution layers of the plurality of redistribution layers have the same shape, and are arranged in the same positions in a plan view perpendicular to the thickness direction.

9. The semiconductor package of claim 1, wherein the plurality of degassing holes included in adjacent redistribution layers of the plurality of redistribution layers have the same shape, but are arranged in staggered positions in a plan view perpendicular to the thickness direction.

10. The semiconductor package of claim 1, further comprising:
a passivation layer having openings exposing portions of a lowermost one of the plurality of redistribution layers; and
electrical connection structures disposed on the passivation layer and electrically connected to the exposed portions of the lowermost one of the plurality of redistribution layers,
wherein at least one of the electrical connection structures is disposed a fan-out region.

11. The semiconductor package of claim 1, further comprising a core member having a through-hole in which the semiconductor chip is disposed.

12. The semiconductor package of claim 1, wherein the at least one of the plurality of redistribution layers includes one integral pattern which includes portions of the plurality of degassing holes penetrating through the one integral pattern.

13. The semiconductor package of claim 1, wherein the connection member further includes anchor vias connecting adjacent redistribution layers of the plurality of redistribution layers to each other.

14. The semiconductor package of claim 13, wherein the anchor vias are disposed adjacent to the degassing holes.

15. A semiconductor package comprising:
a semiconductor chip;
an encapsulant encapsulating the semiconductor chip; and
a connection member disposed on at least one surface of the semiconductor chip and including an insulating layer and a plurality of redistribution layers electrically connected to the semiconductor chip,
wherein at least one of the plurality of redistribution layers includes a plurality of degassing holes penetrating therethrough in a thickness direction,
the plurality of degassing holes included in adjacent redistribution layers of the plurality of redistribution layers have the same shape, but are arranged in staggered positions in a plan view perpendicular to the thickness direction, and
in the plan view perpendicular to the thickness direction, the plurality of degassing holes included in an upper redistribution layer of the adjacent redistribution layers are offset with respect to the plurality of degassing holes included in a lower redistribution layer of the adjacent redistribution layers.

16. A semiconductor package comprising:
a semiconductor chip;
an encapsulant encapsulating the semiconductor chip;
a core member having a through-hole in which the semiconductor chip is disposed; and
a connection member disposed on at least one surface of the semiconductor chip and including an insulating layer and a plurality of redistribution layers electrically connected to the semiconductor chip,
wherein at least one of the plurality of redistribution layers includes a plurality of degassing holes penetrating therethrough in a thickness direction, and
the core member includes wiring layers electrically connected to connection pads of the semiconductor chip.

17. A semiconductor package comprising:
a semiconductor chip;
an encapsulant encapsulating the semiconductor chip;
a core member having a through-hole in which the semiconductor chip is disposed; and
a connection member disposed on at least one surface of the semiconductor chip and including an insulating layer and a plurality of redistribution layers electrically connected to the semiconductor chip,
wherein at least one of the plurality of redistribution layers includes a plurality of degassing holes penetrating therethrough in a thickness direction,
the core member includes a first insulating layer in contact with the connection member, a first wiring layer in contact with the connection member and embedded in the first insulating layer, a second wiring layer disposed on another surface of the first insulating layer opposing one surface of the first insulating layer in which the first wiring layer is embedded, a second insulating layer disposed on the first insulating layer and covering the second wiring layer, and a third wiring layer disposed on the second insulating layer, and
the first to third wiring layers are electrically connected to connection pads of the semiconductor chip.

18. A semiconductor package comprising:
a semiconductor chip;
an encapsulant encapsulating the semiconductor chip;
a core member having a through-hole in which the semiconductor chip is disposed; and
a connection member disposed on at least one surface of the semiconductor chip and including an insulating layer and a plurality of redistribution layers electrically connected to the semiconductor chip,
wherein at least one of the plurality of redistribution layers includes a plurality of degassing holes penetrating therethrough in a thickness direction,
the core member includes a first insulating layer, a first wiring layer and a second wiring layer disposed on opposite surfaces of the first insulating layer, respectively, a second insulating layer disposed on the first insulating layer and covering the first wiring layer, a third wiring layer disposed on the second insulating layer, a third insulating layer disposed on the first insulating layer and covering the second wiring layer, and a fourth wiring layer disposed on the third insulating layer, and
the first to fourth wiring layers are electrically connected to connection pads of the semiconductor chip.

* * * * *